United States Patent [19]

Mori et al.

[11] 4,177,549
[45] Dec. 11, 1979

[54] MACHINE FOR MOUNTING ELECTRICAL COMPONENTS ONTO PRINTED-CIRCUIT BOARDS

[75] Inventors: Kazuhiro Mori; Yoshihiko Misawa; Kiyoshi Mayahara, all of Kadoma, Japan

[73] Assignee: Matsushita Electric Industrial Company, Limited, Japan

[21] Appl. No.: 887,814

[22] Filed: Mar. 17, 1978

[30] Foreign Application Priority Data

Mar. 22, 1977 [JP] Japan .................................. 52-31712

[51] Int. Cl.² ........................ B23P 23/00; B23Q 41/02
[52] U.S. Cl. .................................... 29/564.2; 29/566.2; 29/753
[58] Field of Search ................. 29/564.1, 564.2, 566.2, 29/33 K, 753

[56] References Cited

U.S. PATENT DOCUMENTS

| | | | |
|---|---|---|---|
| 2,854,054 | 9/1958 | Gross | 29/564.1 X |
| 3,550,238 | 12/1970 | Allen et al. | 29/564.1 X |
| 3,711,922 | 1/1973 | Busler et al. | 29/566.2 X |
| 4,114,253 | 9/1978 | Loomis et al. | 29/566.2 |

Primary Examiner—Horace M. Culver
Attorney, Agent, or Firm—Robert E. Burns; Emmanuel J. Lobato; Bruce L. Adams

[57] ABSTRACT

In apparatus for inserting the connecting leads of circuit component parts which are successively arranged along a feeder tape with the leads extending from the tape in a same direction, a mounting bracket is provided which is manually rotatable about a vertical axis and on which are mounted a tape advancing mechanism and a cutter for cutting off the connecting leads of the component part which is brought to a cutting position. An insertion head extends coaxially with the vertical axis to provide reciprocating movement in response to the feeder advancing movement. A gripper is pivotally mounted at the lower end of the insertion head and operable to rotate during the downward movement of the insertion head from a horizontal position to hold the component part whose connecting leads are being cut off to a vertical position to orient the cutoff ends of the leads toward matching holes of a printed-circuit board. The insertion head is also rotatable about the vertical axis with the rotation of the mounting bracket so as to orient the ends of the gripper toward the matching holes. A second gripper is mounted below the first gripper and operable to reciprocate along the vertical axis in synchronism with the feeder advancement to hold the connecting leads which extend downward through the matching holes to give them a bend. The second gripper is also manually rotatable about the vertical axis to permit orientation of its gripping ends to the matching holes.

5 Claims, 19 Drawing Figures

MACHINE FOR MOUNTING ELECTRICAL COMPONENTS ONTO PRINTED-CIRCUIT BOARDS

FIELD OF APPLICATIONS

Figures 1A, 1B:
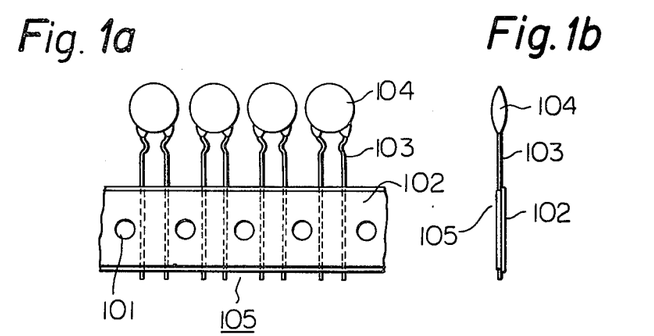
FIG. 1a is an illustration of a plurality of electrical circuit component parts with their circuit connecting leads attached to a feeder tape.
FIG. 1b is a cross-sectional view of the arrangement of FIG. 1.
Figure 2:
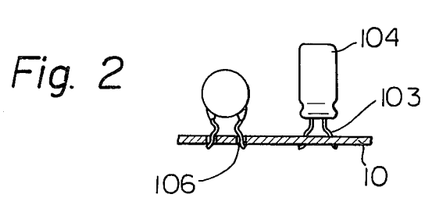
FIG. 2 is an illustration of component parts with their connecting leads inserted into matching holes of a printed-circuit board.
Figure 5:
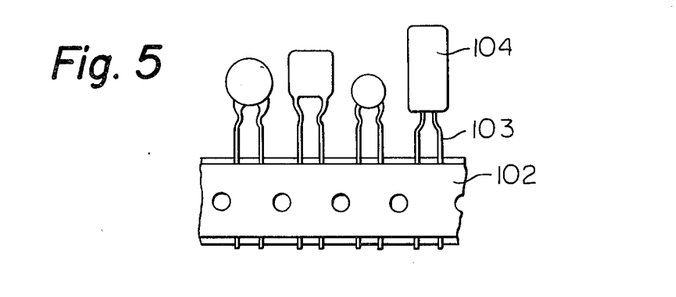
FIG. 5 is an illustration of a plurality of different types of component parts shown attached to a feeder tape.

The present invention relates to apparatus for successively inserting the connecting wires of electrical circuit component parts such as capacitors and resistors (hereinafter called component parts), which are arranged successively on a perforated feeder tape, into matching holes provided in a printed-circuit board. In particular, the invention relates to such apparatus in which, as shown in FIG. 1, the connecting wires 103 of component parts 104 are cut off from a feeder tape and inserted into matching holes of the circuit board. It is to be noted that the component parts 104 are either of the same type as illustrated in FIG. 1 or of the different types as shown in FIG. 5.

OBJECTS OF THE INVENTION

A primary object of the invention is to provide a circuit-leads insertion apparatus which provides ease with which the cutoff ends of the circuit connecting leads are manually aligned with matching holes of a printed-circuit board.

Another object of the invention is to provide a circuit-leads insertion apparatus in which the insertion head is manually rotatable together with its associated mechanism to align the cutoff ends of circuit-leads with the matching holes so that hole alignment operation can be quickly and precisely carried out.

A further object of the invention is to provide a circuit-leads insertion apparatus which comprises an intermittent tape advancing mechanism, a cutter for cutting the connecting leads of a component part which has been advanced to a cutting position, an insertion head having a gripper for holding the component part and downwardly align the cutoff ends of the circuit leads, the insertion head being manually rotatable about a vertical axis together with the tape advancing mechanism and the cutter.

A still further object of the invention is to provide a circuit-leads insertion apparatus in which a second gripper is provided below the insertion head for bending the leads that downwardly extend through the matching holes and wherein the second gripper is manually axially rotatable to orient its gripping ends to the matching holes.

A still further object of the invention is to provide a circuit-leads insertion apparatus in which the first gripper is rotatable between a horizontal position in which the cutter is positioned to cut off the connecting leads of a component part and the gripper is operated to hold the component part and a vertical position in which the cutoff ends of the connecting leads are aligned to the matching holes, whereby the tape advancement operation, cutting operation and insertion operation are carried out in a short period of time.

BRIEF DESCRIPTION OF THE DRAWINGS

The invention will be further described with reference to the accompanying drawings, in which:

FIG. 1a is an illustration of a plurality of electrical circuit component parts with their circuit connecting leads attached to a feeder tape;

FIG. 1b is a cross-sectional view of the arrangement of FIG. 1;

FIG. 2 is an illustration of component parts with their connecting leads inserted into matching holes of a printed-circuit board;

FIG. 3 is a perspective view of an insertion head of a prior art lead insertion apparatus;

FIGS. 4a and 4b are illustrations of the operation of the insertion head of the prior art apparatus;

FIG. 5 is an illustration of a plurality of different types of component parts shown attached to a feeder tape;

FIG. 6a is a front elevation of a lead insertion apparatus of the invention;

FIG. 6b is a side elevation of the apparatus of the invention;

FIG. 7 is a perspective view of a part of the apparatus of the invention useful for understanding the operation of the apparatus;

FIG. 8 is a perspective view of the insertion head of the apparatus of FIGS. 6a and 6b;

FIG. 9 is an illustration of the details of a gripper of the insertion head;

FIGS. 10a, 10b, 11a and 11b are illustrations of the details of the cutter of FIGS. 6a and 6b;

FIGS. 12a and 12b are illustrations of the details of a gripper rotating mechanism mounted in the insertion head;

FIG. 13 is a perspective view of the apparatus of the invention.

DETAILED DESCRIPTION

Prior Art

Figure 3:
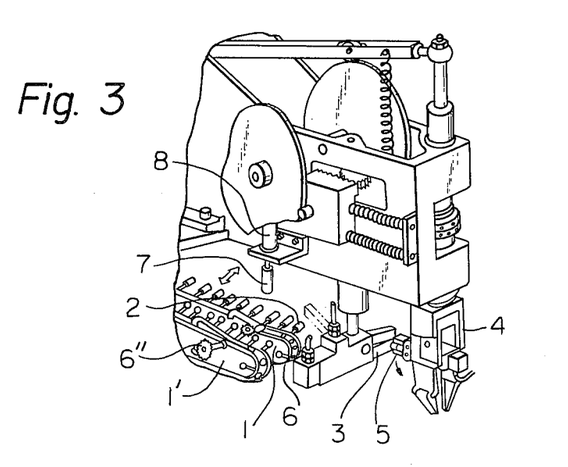
FIG. 3 is a perspective view of an insertion head of a prior art lead insertion apparatus.
Figure 4A:
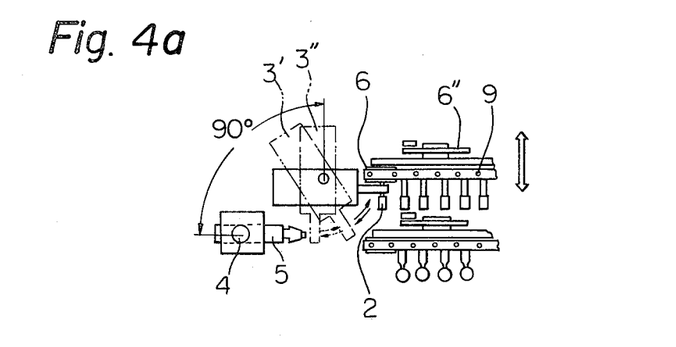
FIGS. 4a and 4b are illustrations of the operation of the insertion head of the prior art apparatus.
Figure 4B:
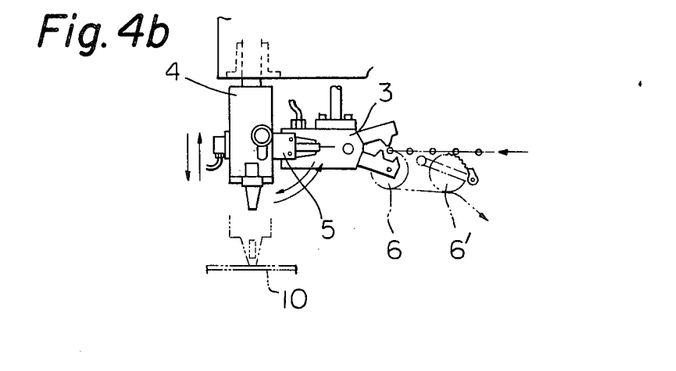

A prior art insertion apparatus will first be described with reference to FIGS. 3, 4a and 4b. FIG. 3 is a perspective view of the insertion heads of the prior art apparatus and FIG. 4a a plan view of the apparatus illustrating the movement of a cutter, and FIG. 4b a side elevation illustrating the movement of a gripper which holds the cutoff component part from a feeder tape. In FIG. 3, reference numeral 1 is a feeder mechanism including a driving ratchet wheel 6' and a sprocket 6 around which is looped the feeder tape to which connecting wires of component parts are secured. In these Figures two feeder mechanisms are shown arranged in parallel in order to enable insertion of different types of component parts. The component parts are equally spaced apart on the feeder tape which is advanced in succession so as to place each component part to a position where cutter 3 is located. In FIG. 4a, the cutter 3 is shown positioned (in solid line 3) to cut off wires of a component part 2 and moved through position indicated by phantom lines 3' to a position indicated by phantom lines 3", whereupon the removed component part 2 is transferred to the gripper 5 which is in turn operated to hold the transferred component. The gripper 5 turns its orientation from horizontal to vertical positions as illustrated in FIG. 4b and is then lowered to a position where a printed-circuit board 10 is placed to receive the wires of the component part through the matching holes provided in the circuit board 10.

However, the prior art apparatus has the following disadvantages: (1) It is difficult to change the azimuth angle of the gripper in order to align the direction of the component part to the matching holes as desired when the orientation of the circuit board is changed, and (2) since the feeder tapes, each carrying a different type of component parts, must be shifted in a direction normal to the direction of movement of the type for changing the types of component parts to be inserted, the cutter must be located in such a position as to gain access to that component part which comes to the end of the feeder so that the orientation of the cutter must be changed to transfer the cutoff component part to the gripper.

Description of the Preferred Embodiments

Figure 6A:
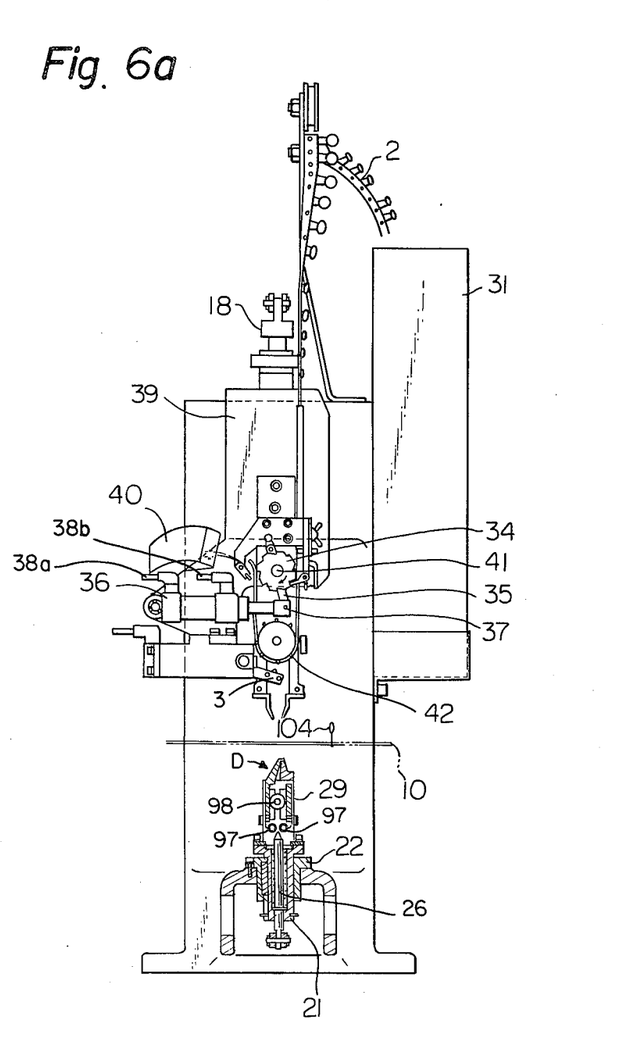
FIG. 6a is a front elevation of a lead insertion apparatus of the invention.
Figure 6B:
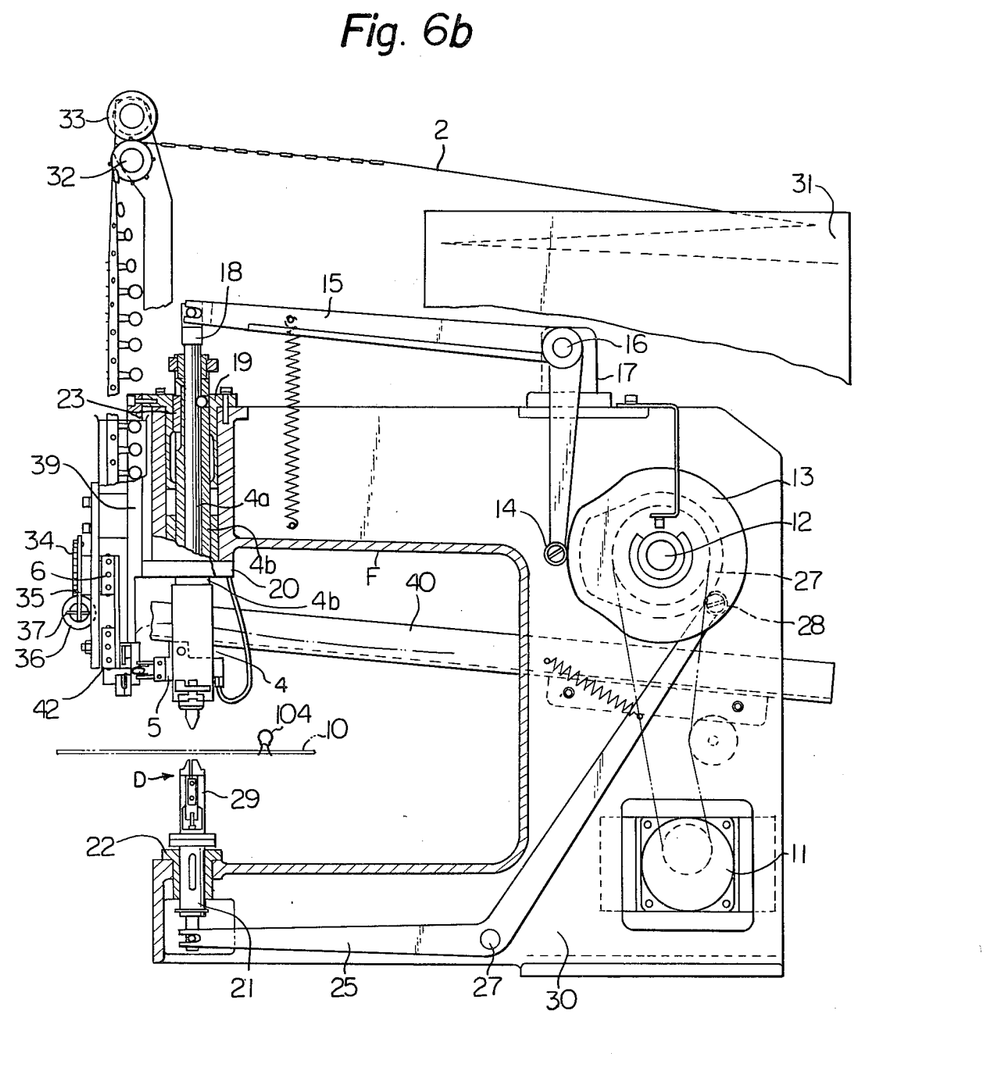
FIG. 6b is a side elevation of the apparatus of the invention.
Figure 13:
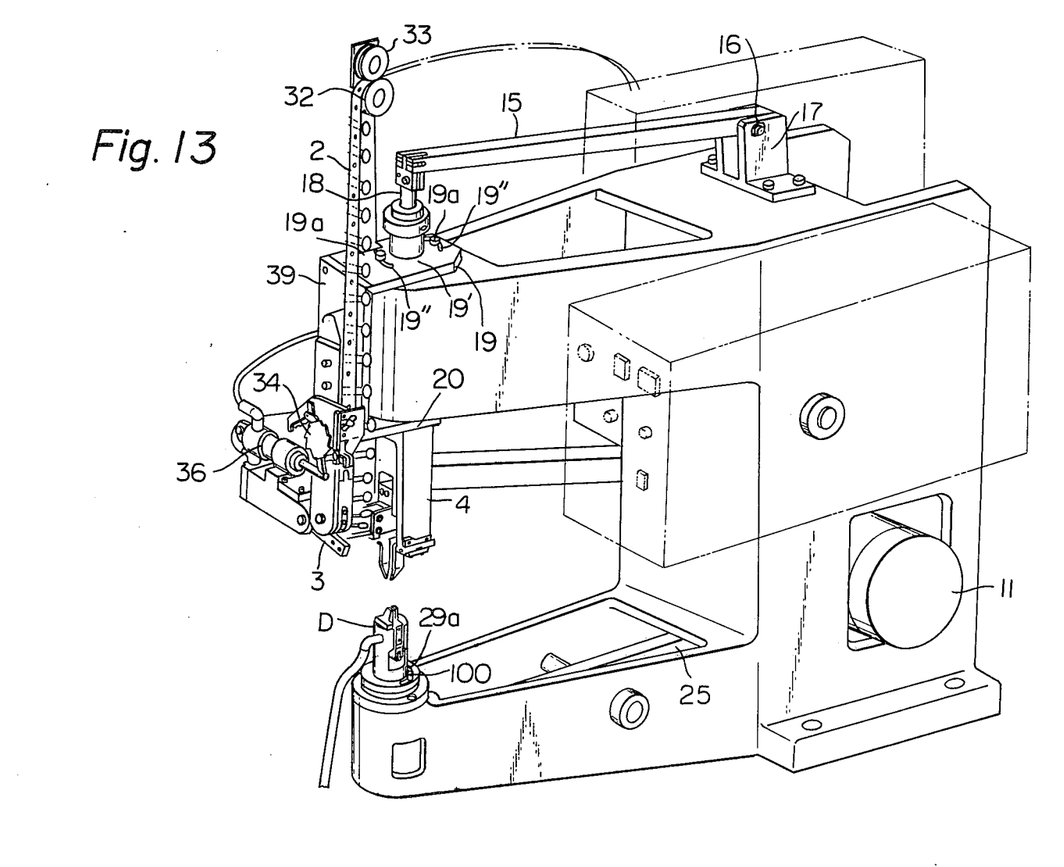
FIG. 13 is a perspective view of the apparatus of the invention.

FIGS. 6a and 6b are illustrations of a preferred embodiment of the invention in which numeral 11 is a motor and, 12 is a cam shaft driven by the motor. A cam 13 is mounted on the cam shaft 12 to engage a roller 14 mounted at the lower end of an L-shaped insertion operating lever 15 with a pivot 16 on bracket 17. Numeral 4 is an insertion head which includes an inner shaft 4a and an outer hollow shaft or sleeve 4b which are mutually slidably movable to each other. Numeral 18 is a joint member which pivotally couples the inner shaft 4a of the insertion head 4 with the insertion operating lever 15. A U-shaped mounting member or bracket, which is formed by a pair of horizontal member 19, 20 and a vertical member 39, is mounted on the end of an arm F of the apparatus. Through the horizontal members 19, 20 extends the sleeve 4b of the insertion head 4. The inner shaft 4a is splined into the outer shaft 4b and the latter is splined into the mounting bracket members 19 and 20 so that both inner and outer shafts are simultaneously rotatable with the rotation of the bracket. As best seen from FIG. 13, the mounting member 19 has a pair of arcuate slots 19' and 19" through which screws 19a extend to the arm F. When screws 19a are loosened the mounting member can be rotated with respect to the vertical axis of the head 4 to manually determine the orientation of the gripper 5 with respect to the matching holes of the circuit board 10. Once the orientation of the gripper 5 is determined, the adjustment screws 19a are fastened to secure the mounting member to the frame of the apparatus. An anvil D is provided having a sleeve 21 through which a vertical shaft 26, connected at the lower end to a rocker arm 25, extends for reciprocation in response to the rocking movement of the arm 25. The sleeve 21 is axially splined with a guide 22 which is manually rotatably mounted on the base portion of the apparatus and fixed in position by a screw 100 (FIG. 13), and engageable with the rocker arm 25 so that the sleeve 21 reciprocates along the axis of the guide 22 and rotates with the guide 22. The azimuth angle of the sleeve 21 and therefore the gripper 29 is adjusted by rotating the guide 22 after screw 100 is loosened. The rocker arm 25 is pivoted as at 27 and provided with a roller 28 at the upper end, which roller engages with a cam 27 mounted for rotation with the cam shaft 12. A gripper 29 is mounted on the sleeve 21 for holding the connecting wires of a component part that extend through the matching holes of the circuit board 10 to provide a bend to the lower end of the extending wires when the gripper 29 moves to an upper position in response to the rocking movement of the arm 25.

With these arrangements, the rotation of motor 11 will cause the upper insertion rocker arm 15 and the lower anvil rocker arms 25 to provide rocking movements about pivots 16 and 27 respectively so that the insertion head 4 and the anvil gripper 29 move in opposite directions to each other, or symmetrically with respect to the circuit board 10.

Figure 7:
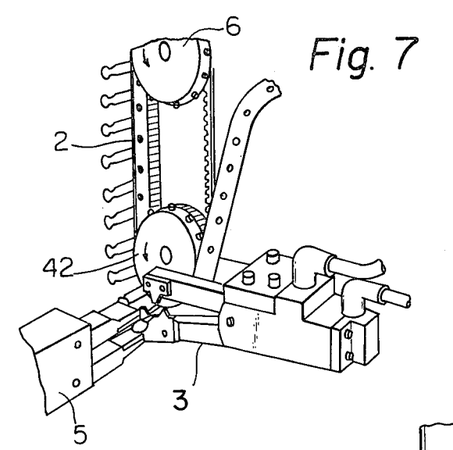
FIG. 7 is a perspective view of a part of the apparatus of the invention useful for understanding the operation of the apparatus.

Reference numeral 31 is a container which holds a folded layer of tape 2 to which component parts are strung in series. The tape 2 is advanced from the container 31 through a pair of guide rollers 32 and 33 and looped around a sprocket 42 which is driven by a ratchet wheel 34 in response to a movement of a pawl 35 connected to an end of a piston 37. This piston is slidably accommodated in an air cylinder 36 mounted on the bracket 39 to provide reciprocating horizontal movement in response to air supply through air inlet ports 38a and 38b. In response to each movement of the piston 37, the ratchet wheel 34 is rotated to advance to the extent that each component part is placed in position where the gripper 5 is located. Cutter 3 is also mounted on the bracket 39 to cut off the wires of the component part which is brought to the position of the gripper 5. After the connecting wires are cut off, the component part is held by the gripper 5 (see FIG. 7).

Figure 8:
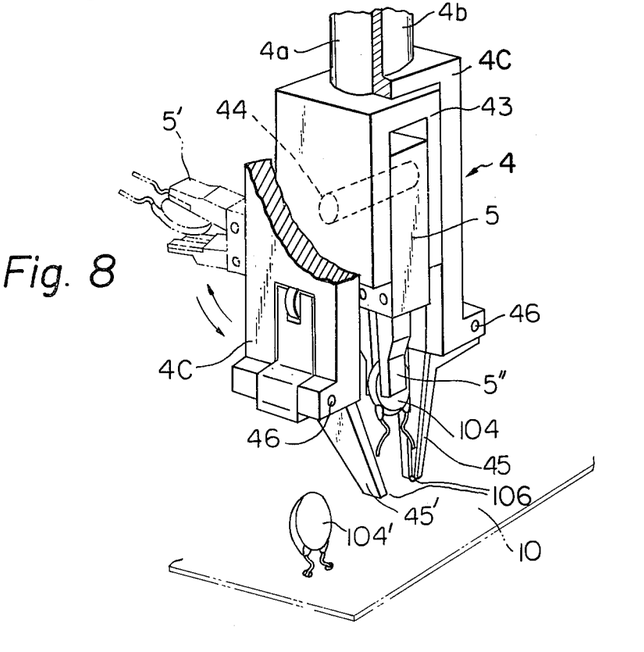
FIG. 8 is a perspective view of the insertion head of the apparatus of FIGS. 6a and 6b.

As seen in FIG. 8, the gripper 5 is pivotally mounted on a shaft 44 which extends between the forked ends 43 of the inner shaft 4a, the forked ends 43 being disposed between the forked ends 4c of the outer shaft or sleeve 4b. The gripper 5, which is normally in a horizontal position as indicated by a phantom line 5', is activated to rotate its gripping ends to a vertical position as indicated by a solid line 5" with the connecting wires being pointed downward and disposed between a pair of slotted wire guides 45 and 45' which are pivotally mounted on the forked ends 4c. This rotational movement of the gripper 5 is accomplished by means of a rotating mechanism, not shown, (which will be described later) during the time when the inner and outer shafts 4a and 4b are moved downward after the cutting operation. As soon as the slotted guides 45, 45' reach the upper surface of the circuit board 10, the outer shaft 4b is brought to a halt, while the inner shaft 4a continues to move downward in order to allow the connecting wires of the part 104 to be guided through the slots of guides 45, 45' until they are inserted through the matching holes 106. Concurrently, the anvil gripper 29 is moved upward to hold the lower ends of the wires to give them a bend so that the component part 104' can stand in an upright position as at 104'.

Figure 9:
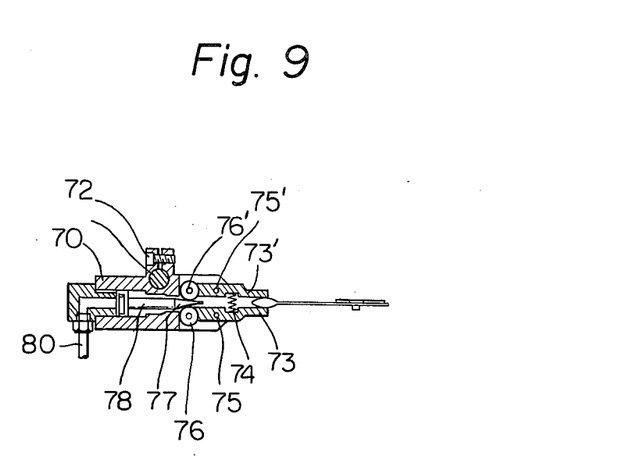
FIG. 9 is an illustration of the details of a gripper of the insertion head.

FIG. 9 shows the details of the gripper 5. The gripper 5 comprises a pair of gripping ends or pincers 73, 73' which are pivoted at 75, 75' and biased by means of a spring 74 to be urged away from each other and provided with a pair of rollers 76, 76' at the inner ends thereof. A tapered piston 77 with a piston head 78 is slidably disposed within a cylinder 70 which communicates with an air inlet port 80. Under normal conditions, the pincers 73, 73' are held open by the spring 74 and closed when the tapered end of the piston rod 77 is moved leftward by pressurized air flow introduced through port 80 to engage between the rollers 76, 76' in opposition to the spring force.

FIGS. 10a, 10b, 11a and 11b show the details of the cutter 3. As shown the cutter comprises a pair of arms 81, 81' pivoted at 85 and biased away from each other by means of a spring 84 disposed therebetween and provided with complementary shaped cutting edges 82 and 83 at the forward ends and a pair of rollers 86, 86' at the rear ends. A piston rod 88 having a tapered end is slidably disposed within a cylinder 87 which communicates with a first air inlet port 91 through duct 89 and a second air inlet port 92 through duct 90. Normally, the piston rod 88 is in a retracted position to allow the cutting edges to remain open. In response to an increase

MACHINE FOR MOUNTING ELECTRICAL COMPONENTS ONTO PRINTED-CIRCUIT BOARDS

FIELD OF APPLICATIONS

The present invention relates to apparatus for successively inserting the connecting wires of electrical circuit component parts such as capacitors and resistors (hereinafter called component parts), which are arranged successively on a perforated feeder tape, into matching holes provided in a printed-circuit board. In particular, the invention relates to such apparatus in which, as shown in FIG. 1, the connecting wires 103 of component parts 104 are cut off from a feeder tape and inserted into matching holes of the circuit board. It is to be noted that the component parts 104 are either of the same type as illustrated in FIG. 1 or of the different types as shown in FIG. 5.

OBJECTS OF THE INVENTION

A primary object of the invention is to provide a circuit-leads insertion apparatus which provides ease with which the cutoff ends of the circuit connecting leads are manually aligned with matching holes of a printed-circuit board.

Another object of the invention is to provide a circuit-leads insertion apparatus in which the insertion head is manually rotatable together with its associated mechanism to align the cutoff ends of circuit-leads with the matching holes so that hole alignment operation can be quickly and precisely carried out.

A further object of the invention is to provide a circuit-leads insertion apparatus which comprises an intermittent tape advancing mechanism, a cutter for cutting the connecting leads of a component part which has been advanced to a cutting position, an insertion head having a gripper for holding the component part and downwardly align the cutoff ends of the circuit leads, the insertion head being manually rotatable about a vertical axis together with the tape advancing mechanism and the cutter.

A still further object of the invention is to provide a circuit-leads insertion apparatus in which a second gripper is provided below the insertion head for bending the leads that downwardly extend through the matching holes and wherein the second gripper is manually axially rotatable to orient its gripping ends to the matching holes.

A still further object of the invention is to provide a circuit-leads insertion apparatus in which the first gripper is rotatable between a horizontal position in which the cutter is positioned to cut off the connecting leads of a component part and the gripper is operated to hold the component part and a vertical position in which the cutoff ends of the connecting leads are aligned to the matching holes, whereby the tape advancement operation, cutting operation and insertion operation are carried out in a short period of time.

BRIEF DESCRIPTION OF THE DRAWINGS

The invention will be further described with reference to the accompanying drawings, in which.

DETAILED DESCRIPTION

Prior Art

A prior art insertion apparatus will first be described with reference to FIGS. 3, 4a and 4b. FIG. 3 is a perspective view of the insertion heads of the prior art apparatus and FIG. 4a a plan view of the apparatus illustrating the movement of a cutter, and FIG. 4b a side elevation illustrating the movement of a gripper which holds the cutoff component part from a feeder tape. In FIG. 3, reference numeral 1 is a feeder mechanism including a driving ratchet wheel 6' and a sprocket 6 around which is looped the feeder tape to which connecting wires of component parts are secured. In these Figures two feeder mechanisms are shown arranged in parallel in order to enable insertion of different types of component parts. The component parts are equally spaced apart on the feeder tape which is advanced in succession so as to place each component part to a position where cutter 3 is located. In FIG. 4a, the cutter 3 is shown positioned (in solid line 3) to cut off wires of a component part 2 and moved through position indicated by phantom lines 3' to a position indicated by phantom lines 3", whereupon the removed component part 2 is transferred to the gripper 5 which is in turn operated to hold the transferred component. The gripper 5 turns its orientation from horizontal to vertical positions as illustrated in FIG. 4b and is then lowered to a position where a printed-circuit board 10 is placed to receive the wires of the component part through the matching holes provided in the circuit board 10.

However, the prior art apparatus has the following disadvantages: (1) It is difficult to change the azimuth angle of the gripper in order to align the direction of the component part to the matching holes as desired when the orientation of the circuit board is changed, and (2) since the feeder tapes, each carrying a different type of component parts, must be shifted in a direction normal to the direction of movement of the type for changing the types of component parts to be inserted, the cutter must be located in such a position as to gain access to that component part which comes to the end of the feeder so that the orientation of the cutter must be changed to transfer the cutoff component part to the gripper.

Description of the Preferred Embodiments

FIGS. 6a and 6b are illustrations of a preferred embodiment of the invention in which numeral 11 is a motor and, 12 is a cam shaft driven by the motor. A cam 13 is mounted on the cam shaft 12 to engage a roller 14 mounted at the lower end of an L-shaped insertion operating lever 15 with a pivot 16 on bracket 17. Numeral 4 is an insertion head which includes an inner shaft 4a and an outer hollow shaft or sleeve 4b which are mutually slidably movable to each other. Numeral 18 is a joint member which pivotally couples the inner shaft 4a of the insertion head 4 with the insertion operating lever 15. A U-shaped mounting member or bracket, which is formed by a pair of horizontal member 19, 20 and a vertical member 39, is mounted on the end of an arm F of the apparatus. Through the horizontal members 19, 20 extends the sleeve 4b of the insertion head 4. The inner shaft 4a is splined into the outer shaft 4b and the latter is splined into the mounting bracket members 19 and 20 so that both inner and outer shafts are simultaneously rotatable with the rotation of the bracket. As best seen from FIG. 13, the mounting member 19 has a pair of arcuate slots 19' and 19" through which screws 19a extend to the arm F. When screws 19a are loosened the mounting member can be rotated with respect to the vertical axis of the head 4 to manually determine the orientation of the gripper 5 with respect to the matching holes of the circuit board 10. Once the orientation of the gripper 5 is determined, the adjustment screws 19a are fastened to secure the mounting member to the frame of the apparatus. An anvil D is provided having a sleeve 21 through which a vertical shaft 26, connected at the lower end to a rocker arm 25, extends for reciprocation in response to the rocking movement of the arm 25. The sleeve 21 is axially splined with a guide 22 which is manually rotatably mounted on the base portion of the apparatus and fixed in position by a screw 100 (FIG. 13), and engageable with the rocker arm 25 so that the sleeve 21 reciprocates along the axis of the guide 22 and rotates with the guide 22. The azimuth angle of the sleeve 21 and therefore the gripper 29 is adjusted by rotating the guide 22 after screw 100 is loosened. The rocker arm 25 is pivoted as at 27 and provided with a roller 28 at the upper end, which roller engages with a cam 27 mounted for rotation with the cam shaft 12. A gripper 29 is mounted on the sleeve 21 for holding the connecting wires of a component part that extend through the matching holes of the circuit board 10 to provide a bend to the lower end of the extending wires when the gripper 29 moves to an upper position in response to the rocking movement of the arm 25.

With these arrangements, the rotation of motor 11 will cause the upper insertion rocker arm 15 and the lower anvil rocker arms 25 to provide rocking movements about pivots 16 and 27 respectively so that the insertion head 4 and the anvil gripper 29 move in opposite directions to each other, or symmetrically with respect to the circuit board 10.

Reference numeral 31 is a container which holds a folded layer of tape 2 to which component parts are strung in series. The tape 2 is advanced from the container 31 through a pair of guide rollers 32 and 33 and looped around a sprocket 42 which is driven by a ratchet wheel 34 in response to a movement of a pawl 35 connected to an end of a piston 37. This piston is slidably accommodated in an air cylinder 36 mounted on the bracket 39 to provide reciprocating horizontal movement in response to air supply through air inlet ports 38a and 38b. In response to each movement of the piston 37, the ratchet wheel 34 is rotated to advance to the extent that each component part is placed in position where the gripper 5 is located. Cutter 3 is also mounted on the bracket 39 to cut off the wires of the component part which is brought to the position of the gripper 5. After the connecting wires are cut off, the component part is held by the gripper 5 (see FIG. 7).

As seen in FIG. 8, the gripper 5 is pivotally mounted on a shaft 44 which extends between the forked ends 43 of the inner shaft 4a, the forked ends 43 being disposed between the forked ends 4c of the outer shaft or sleeve 4b. The gripper 5, which is normally in a horizontal position as indicated by a phantom line 5', is activated to rotate its gripping ends to a vertical position as indicated by a solid line 5" with the connecting wires being pointed downward and disposed between a pair of slotted wire guides 45 and 45' which are pivotally mounted on the forked ends 4c. This rotational movement of the gripper 5 is accomplished by means of a rotating mechanism, not shown, (which will be described later) during the time when the inner and outer shafts 4a and 4b are moved downward after the cutting operation. As soon as the slotted guides 45, 45' reach the upper surface of the circuit board 10, the outer shaft 4b is brought to a halt, while the inner shaft 4a continues to move downward in order to allow the connecting wires of the part 104 to be guided through the slots of guides 45, 45' until they are inserted through the matching holes 106. Concurrently, the anvil gripper 29 is moved upward to hold the lower ends of the wires to give them a bend so that the component part 104' can stand in an upright position as at 104'.

FIG. 9 shows the details of the gripper 5. The gripper 5 comprises a pair of gripping ends or pincers 73, 73' which are pivoted at 75, 75' and biased by means of a spring 74 to be urged away from each other and provided with a pair of rollers 76, 76' at the inner ends thereof. A tapered piston 77 with a piston head 78 is slidably disposed within a cylinder 70 which communicates with an air inlet port 80. Under normal conditions, the pincers 73, 73' are held open by the spring 74 and closed when the tapered end of the piston rod 77 is moved leftward by pressurized air flow introduced through port 80 to engage between the rollers 76, 76' in opposition to the spring force.

Figure 10A:
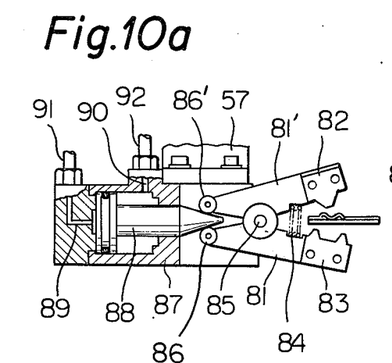
FIGS. 10a, 10b, 11a and 11b are illustrations of the details of the cutter of FIGS. 6a and 6b.
Figure 10B:
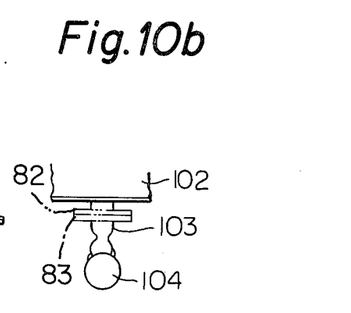
Figure 11A:
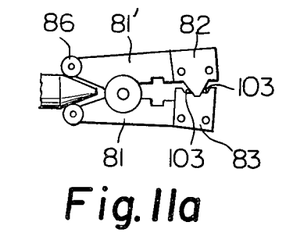
Figure 11B:
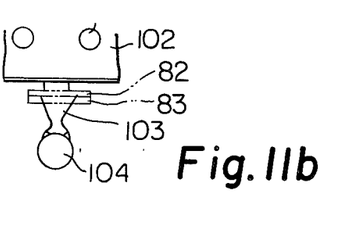

FIGS. 10a, 10b, 11a and 11b show the details of the cutter 3. As shown the cutter comprises a pair of arms 81, 81' pivoted at 85 and biased away from each other by means of a spring 84 disposed therebetween and provided with complementary shaped cutting edges 82 and 83 at the forward ends and a pair of rollers 86, 86' at the rear ends. A piston rod 88 having a tapered end is slidably disposed within a cylinder 87 which communicates with a first air inlet port 91 through duct 89 and a second air inlet port 92 through duct 90. Normally, the piston rod 88 is in a retracted position to allow the cutting edges to remain open. In response to an increase in pressure by the flow introduced through the first inlet port 91, the piston 88 is moved to the left to push aside the rear ends of the cutter to close the cutting edges. As shown in FIG. 10b, the connecting wires 103 of the component part 104 extend parallel to each other from the feeder tape 102 with the cutting edges 82, 83 positioned midway of the connecting wires. After the cutting operation is completed, the pressure at the first air inlet port 91 is decreased while the pressure in the second air inlet port 92 is increased to return the piston 88 to the normal position. As illustrated in FIG. 11a, the cutting edges 82 and 83 are so shaped that the lower cutting edge 83 has a generally U-shaped recess in which the connecting wires 103 are positioned and the upper cutting edge 82 has a downwardly extending tapered portion which is brought in between the connecting wires to push aside them as the cutting edges come closer to each other. Upon cutting, the cutoff ends of the connecting wires 103 are spaced wider toward their ends as illustrated in FIG. 11b. This widened spacing of the connecting wires is to assure contact with the slots of the guide members 45, 45' so as to advance therethrough until they are inserted to the matching holes.

Figure 12A:
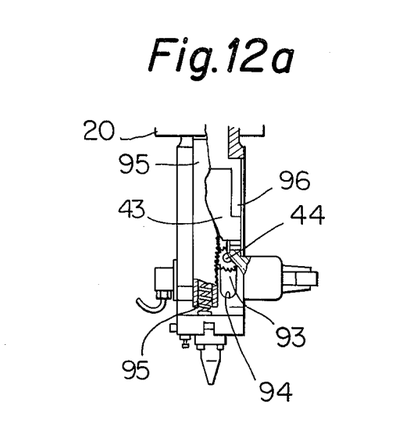
FIGS. 12a and 12b are illustrations of the details of a gripper rotating mechanism mounted in the insertion head.
Figure 12B:
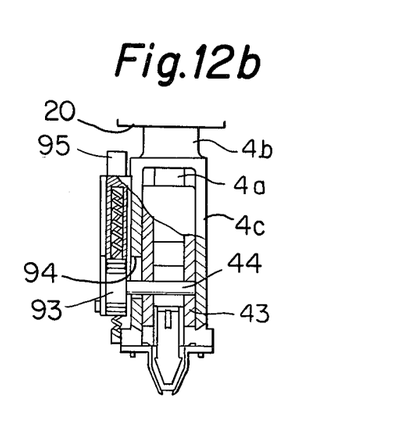

The rotating mechanism of the gripper 5 is illustrated in FIGS. 12a and 12b. A vertical rack 95 is resiliently mounted on the lower end portion of the forked end 4c so that, when the insertion head 4 is in the upper dead point, the upper end of the rack 95 against the lower surface of the mounting member 20. This permits the rack 95 to be held stationary with respect to the frame of the apparatus until the sleeve 4b is lowered below a predetermined level. The pivot shaft 44, on which the gripper 5 is mounted, extends through an elongated opening 94 provided in the side wall of the forked ends 4c to secure a pinion 93 for engagement with the rack 95. Therefore, during the downward travel of the insertion head 4 the pinion 93 and thus the gripper 5 rotates in clockwise direction to the vertical position until the gripper 5 comes into engagement with the stopper 96. As the sleeve 4b is lowered below the predetermined level, the rack 95 is disengaged from contact with the mounting member 20 as illustrated in FIG. 12b so that the rack 95 becomes stationary with respect to the sleeve 4b so that the pinion 93 is prevented from being further rotated.

Referring back to FIGS. 6a and 6b, the anvil gripper 29 comprises a pair of pivoted pincers 97 having rollers 98 which are engageable with the upper tapered end of the shaft 26. Upon the upward movement of the tapered shaft 26 in response to an upward rocking movement of the rocker arm 25, the tapered end of the shaft 26 comes into engagement with the rollers 98 to close the pincers 97 with the connecting leads being held therebetween. A further upward movement will cause the sleeve 21 to move upward so that the connecting wires are bent in one direction.

After insertion operations, the leading end of the feeder tape which moves past the gripper 5 is led off to a chute 40 to be discarded.

When it is desired to realign the orientation of the component part being held by the gripper 5 into the matching holes of a circuit board 10 whenever the latter is changed in orientation, this can be easily accomplished by simply loosening the screws 19a and 100 and rotating the mounting bracket 39 and the anvil D about the insertion axis. The ease with which the reorientation of the gripper 5 is manually performed provides a greater flexibility for circuit designers in designing printed circuits. Since the insertion machine of the invention is simple in construction, compact and lightweight, it is possible to mount the machine on the X-Y table of a numerically controlled (NC) positioning system and instructs it to orient the insertion head automatically in response to a signal derived in accordance with the direction of the matching hole.

What is claimed is:

1. Apparatus for inserting the connecting wires of successively arranged electrical circuit component parts on a feeding tape into matching holes of a circuit board, said connecting wires extending in a same direction from said feeder tape, comprising: a mounting bracket rotatable about an axis along which the connecting wires are inserted into said matching holes; means for fixing said bracket in an arbitrary position with respect to said axis; means mounted on said bracket for intermittently advancing said feeder tape; a cutter mounted on said bracket and operable to successively cut off the connecting wires of each of said component parts in response to each intermittent advancement of said feeder tape; an insertion head operable to reciprocate along said axis and rotatable with said mounting bracket to take up said arbitrary position and including a first gripper operable to rotate, during the time when said insertion head is moved downward, from a first position in which the gripper holds the cutoff component part to a second position in which the connecting wires of the held component part are substantially oriented toward said matching holes; and a second gripper disposed below said insertion head and operable to reciprocate along said axis in directions opposite to the directions of movement of said insertion head for holding the connecting wires that extend through the matching holes to give a bend thereto.

2. Apparatus as claimed in claim 1, wherein said second gripper is rotatable about said axis, further comprising means for fixing said second gripper in an arbitrary position.

3. Apparatus as claimed in claim 1, wherein said first gripper is rotatable through an angle of 90 degrees from a horizontally oriented position to a vertically oriented position, and wherein said tape advancing means includes a sprocket located in a position with respect to said first gripper in said first position such that a component part proper is positioned between the gripping ends of said first gripper with the connecting wires extending between the cutting edges of said cutter in response to each intermittent advancement of said feeder tape.

4. Apparatus as claimed in claim 1, wherein said insertion head and second gripper are mounted on a same vertical axis, further comprising first and second cams mounted on a same rotating cam shaft for unitary rotation and first and second linkage means for respectively reciprocating said insertion head and said second gripper along said vertical axis.

5. Apparatus for inserting the connecting wires of successively arranged electrical component part into matching holes of a circuit board, said connecting wires extending in a same direction from a feeder tape, comprising: a mounting bracket rotatable about a vertical axis; means for fixing said bracket in a desired angular position with respect to said vertical axis; means mounted on said bracket for intermittently advancing said feeder tape; an outer shaft and an inner shaft axially slidably disposed in said outer shaft, said outer and inner shafts being respectively movable along said vertical axis and simultaneously rotatable about said vertical axis with the rotation of said mounting bracket; a pair of vertically extending slotted guides coupled to the lower end of said outer shaft for guiding the connecting wires of each component part into the matching holes; an insertion head coupled to the lower end of said inner shaft having a first gripper rotatably mounted between a horizontal position for holding a said component part and a vertical position for inserting the connecting wires of the held component part into the matching holes, and means for rotating said first gripper between said horizontal and vertical positions during the time when said outer and inner shafts are moved axially along said vertical axis; a cutter mounted on said bracket for cutting off the connecting wires of a said component part positioned between the gripping ends of said first gripper; a second gripper vertically slidably mounted opposite to said first gripper when in said vertical position and movable between a low position and a high position to hold the connecting wires of said component part that extend through the matching holes to give a bend thereto; and means for imparting a reciprocating movement to said outer and inner shafts and to said second gripper in directions opposite to the directions of movement of said outer and inner shafts.

* * * * *